United States Patent [19]

Wisniewski et al.

[11] 4,336,564
[45] Jun. 22, 1982

[54] SOLENOID CONTROL CIRCUIT

[75] Inventors: Waldemar S. Wisniewski, Orangevale; Henry S. More, Carmichael, both of Calif.

[73] Assignee: Exploration Logging, Inc., Sacramento, Calif.

[21] Appl. No.: 169,763

[22] Filed: Jul. 17, 1980

Related U.S. Application Data

[63] Continuation-in-part of Ser. No. 26,881, Apr. 4, 1979.

[51] Int. Cl.³ .............................................. G01V 1/14
[52] U.S. Cl. ..................................... 361/154; 367/85
[58] Field of Search .......................... 361/154; 367/85; 335/239

[56] References Cited

U.S. PATENT DOCUMENTS

| | | | |
|---|---|---|---|
| 3,594,615 | 7/1971 | Cortelli | 361/154 |
| 3,736,558 | 5/1973 | Cubberly, Jr. | 367/85 |
| 3,737,736 | 6/1973 | Stampfli | 361/154 |
| 3,766,432 | 10/1973 | Markowitz et al. | 361/154 |
| 3,864,608 | 2/1975 | Normile et al. | 361/154 |
| 3,943,416 | 3/1976 | Degenhart | 361/154 |
| 3,943,476 | 3/1976 | Iyeta | 335/239 |
| 4,027,282 | 5/1977 | Jeter | 367/85 |

FOREIGN PATENT DOCUMENTS

| | | | |
|---|---|---|---|
| 1151189 | 1/1958 | France | 361/154 |
| 587514 | 5/1968 | U.S.S.R. | 361/154 |

OTHER PUBLICATIONS

Farman, A. A., "Economical Relay", *Practical Electronics*, vol. 13, No. 3, Mar. 1977, p. 222.

*Primary Examiner*—J. D. Miller
*Assistant Examiner*—L. C. Schroeder
*Attorney, Agent, or Firm*—Christie, Parker & Hale

[57] ABSTRACT

In response to a signal to open and close a solenoid-operated valve, which is urged closed by flow of fluid through it, a circuit supplies a large current to the solenoid to open the valve, reduces the current to hold the valve open, and interrupts the current to close the valve. The circuit provides high electrical efficiency during operation. One embodiment of the invention is particularly suitable for use in systems in which the voltage of the power source varies over a wide range.

5 Claims, 10 Drawing Figures

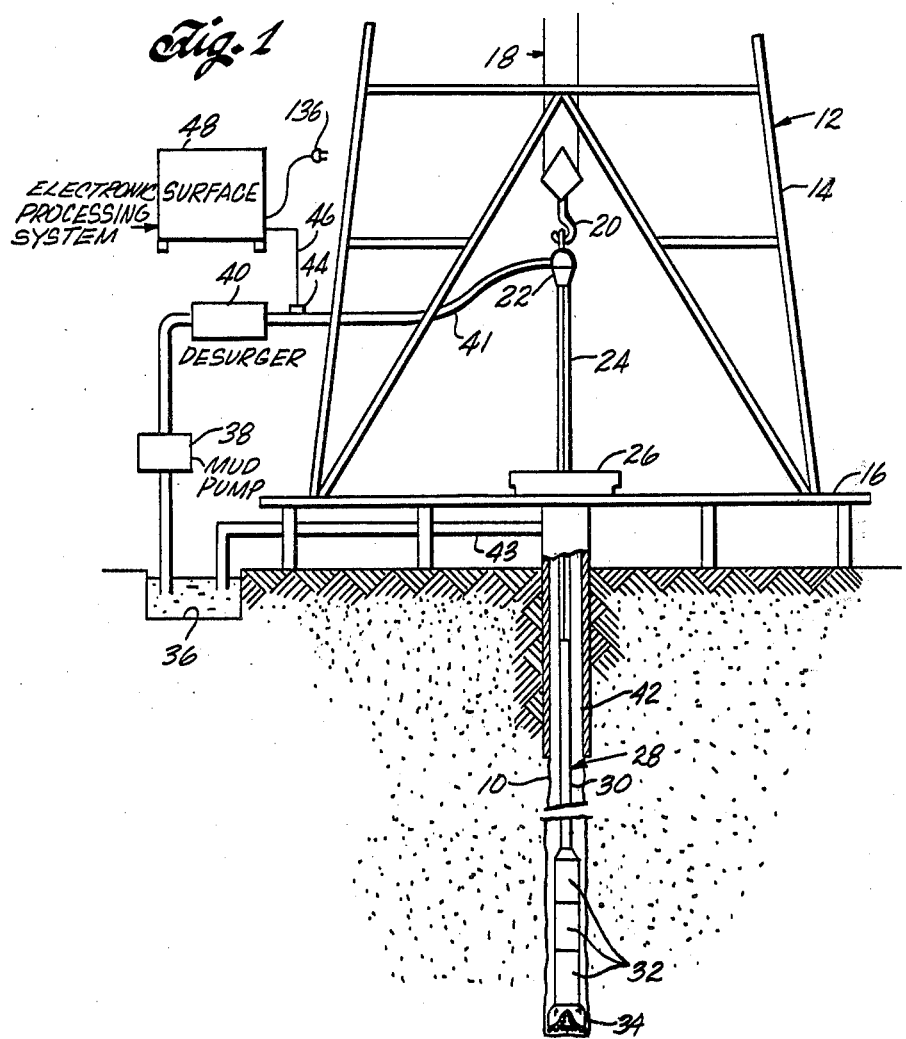

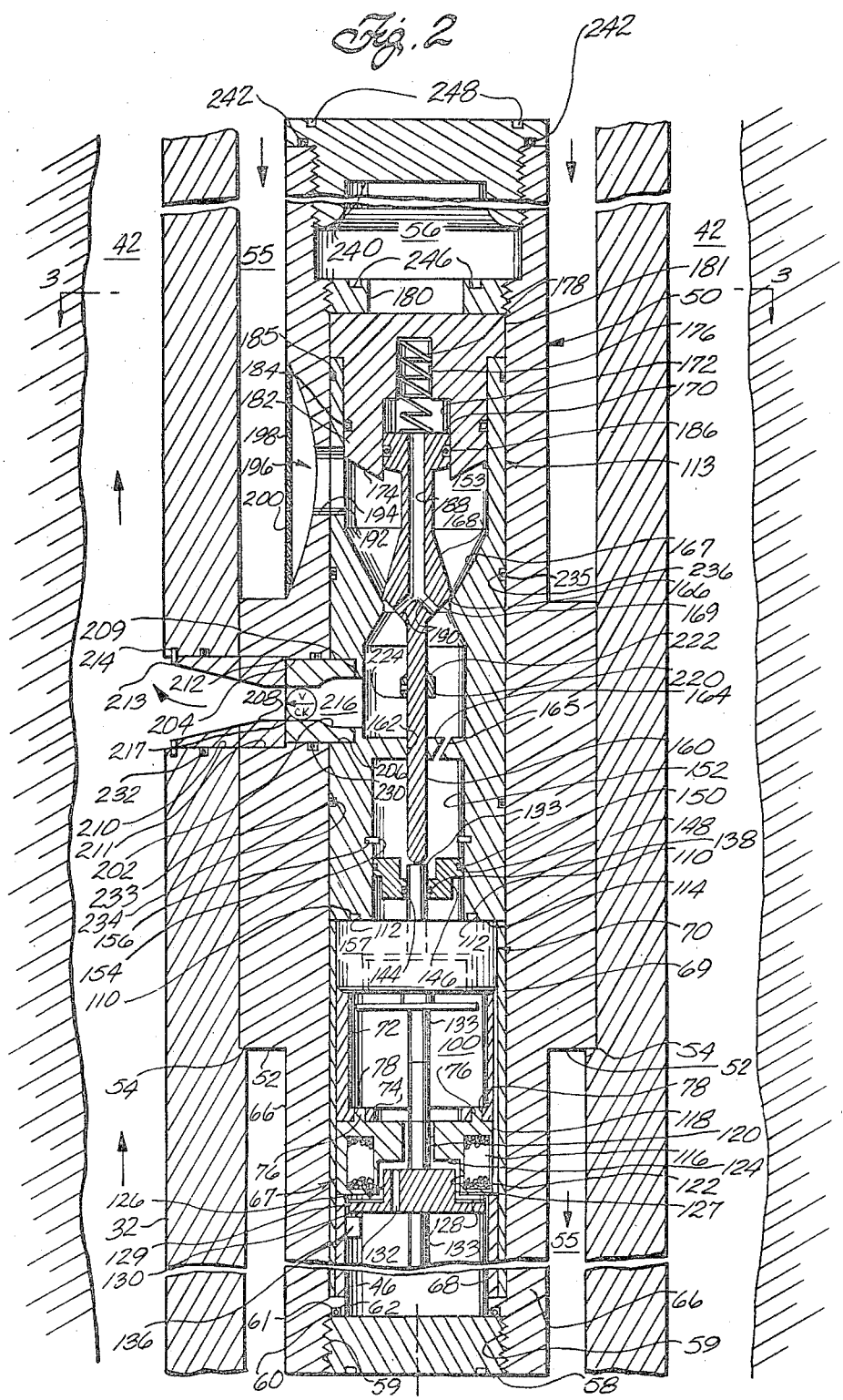

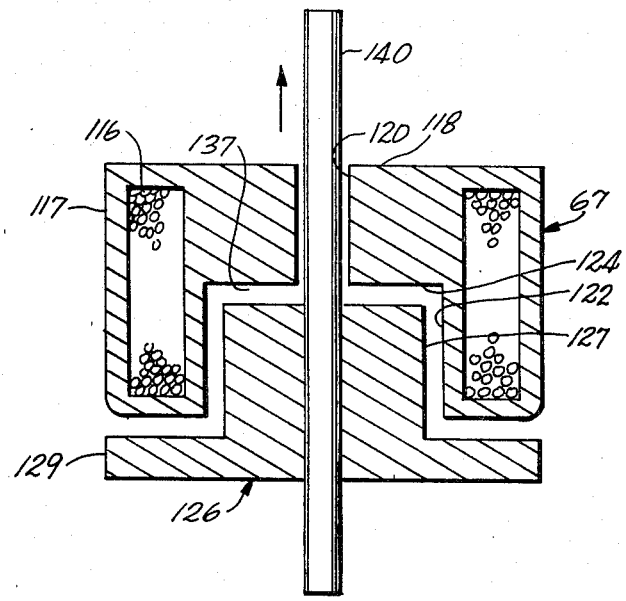
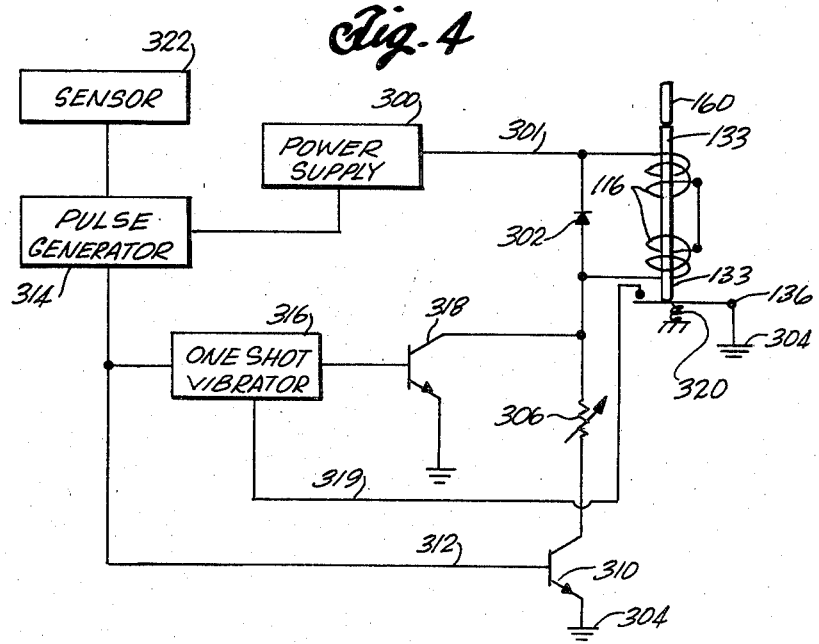

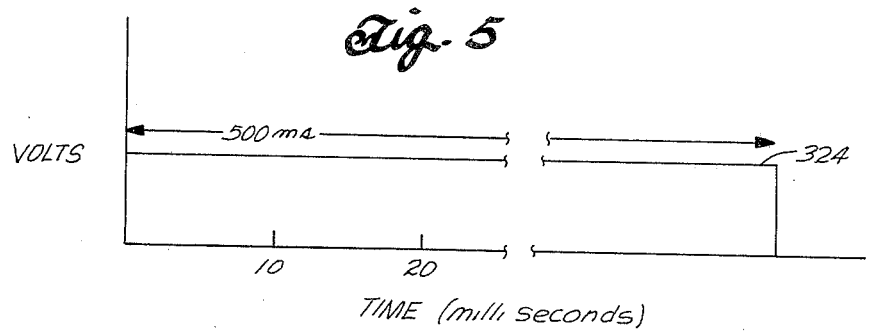
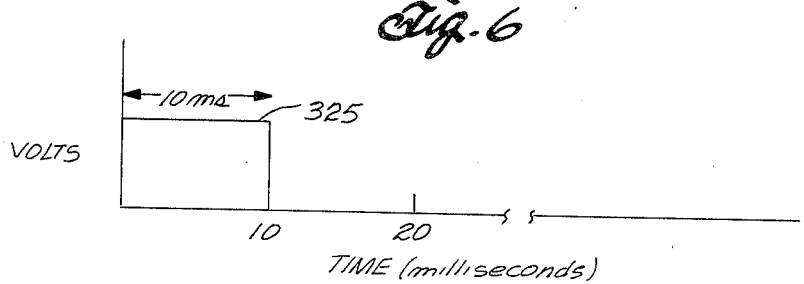
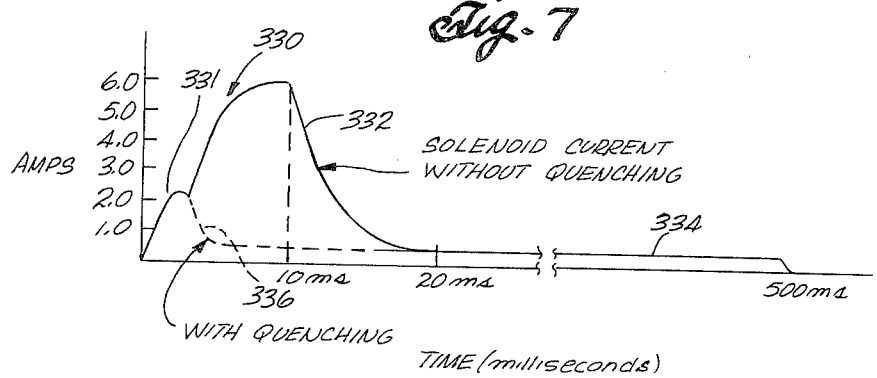

SOLENOID CONTROL CIRCUIT

CROSS REFERENCE TO RELATED APPLICATIONS

This application is a continuation-in-part of patent application Ser. No. 26,881 filed on Apr. 4, 1979.

BACKGROUND OF THE INVENTION

1. Field of the Invention

This invention relates to solenoid control circuits which are particularly useful in logging wells during drilling.

2. The Prior Art

The advantages of logging while drilling have long been recognized. However, the lack of a practical telemetering system has been a major obstacle to successful logging while drilling.

Of the various systems considered for logging while drilling, the most promising uses a solenoid-operated valve to create negative pressure pulses in the drilling fluid circulated through the drill string, drill bit, and borehole annulus. The negative pressure pulses are generated by intermittently opening and closing the valve to bypass a relatively small proportion of the total drilling fluid flow around the drill bit.

U.S. Pat. No. 4,078,620 shows a system which vents drilling fluid from the drill string interior to the annular space between the drill string and the borehole of the well to send negative pulses to the surface in a coded sequence corresponding to a sensed downhole condition. The Oil and Gas Journal, June 12, 1978, at page 71, discloses a similar system.

A general problem with using pressure pulses in the drilling fluid to send information is that the pulse generators to date have been bulky and, therefore, impose a wasteful pressure drop in the drilling fluid flowing through the drill string. The solenoid requires that the pulse generator be a certain minimum size because the solenoid must be large enough to supply the force needed to operate the valve, and it should require as little power as possible to extend operating time when only battery power is available. Even if an electrical generator is used downhole, the current required by the solenoid should be a minimum to permit reduction of solenoid size, and to avoid overheating, which is a serious problem in deep wells where downhole temperatures may exceed 300° F.

This invention provides an efficient solenoid control circuit which permits the use of a relatively small solenoid, low operating power, and the design of a "slim" pulse generator to minimize energy losses due to drilling pressure drop in the drill string, and to permit the use of drill collars with a small outside diameter for deep drilling.

The solenoid circuit of this invention supplies a large opening current, followed by a smaller holding current to operate the valve and generate negative pressure pulses in a safe, efficient, and reliable manner. The switch control circuitry of FIGS. 8–10 in part is the subject of copending patent application Ser. No. 169,764 filed concurrently herewith.

SUMMARY OF THE INVENTION

The circuits of this invention include a source of electrical power having a pair of output terminals. In one embodiment of this invention a first switch is arranged to connect a solenoid winding across the terminals through a first path of relatively low electrical impedance, and a second switch is arranged to connect the solenoid winding across the terminals through a second path of relatively high electrical impedance. A long-pulse generator output is connected to the input of a short-pulse generator and to the second switch. The output of the short-pulse generator is connected to the first switch. Means are provided for activating the long-pulse generator to apply a relatively long pulse to the short-pulse generator input and to the second switch so the first switch is made conducting for the duration of a short pulse from the short-pulse generator, and the second switch is made conducting for the duration of the long pulse. Preferably, the short-pulse generator is a one-shot multivibrator, and the switches are transistors. A variable resistance in the second path permits the current in that path to be adjusted to any desired value.

Preferably, the solenoid includes a core disposed to be magnetized when the winding is energized. An armature is mounted to be movable toward and away from the core as the winding is energized and de-energized. Means are provided for sensing the movement of the armature and terminating the short pulse when the armature moves so that the armature is urged toward the core by current through the low impedance path after the short pulse is terminated. Preferably, a third switch operates in response to movement of the armature to interrupt current flow through the first path.

A diode rectifier is connected across the solenoid winding so that back e.m.f. generated within the winding when current in the winding tends to decrease supplies "free wheel" current through the winding.

Preferably, the short pulse is between about 1% and about 50% of the time of the long pulse, and current through the second path is between about 1% and about 50% of the current which flows through the first path.

When used to operate a valve that is urged toward a closed position by the flow of drilling fluid, the armature moves a shaft which actuates the valve. The circuit supplies a relatively high current to the solenoid to generate enough force to open the valve. The force required to hold the valve open is substantially less than that required to open it. Therefore, after the valve opens, the current to the solenoid is reduced to a value which generates a force just sufficient to overcome the closing force generated by the flow of fluid through the valve. The solenoid is subsequently de-energized so that the fluid flow through the valve closes it.

In another embodiment of the invention the long-pulse generator and the short-pulse generator are employed to control the sequence of operations in a circuit for controlling the direct current that is applied to the solenoid windings. In this embodiment, the direct current for actuating the solenoid and the smaller current for holding it are each controlled so that the current is substantially constant for each value. This embodiment of the invention is particularly suitable for use in systems in which the voltage of the source of power varies over a wide range.

BRIEF DESCRIPTION OF THE DRAWINGS

FIG. 1 shows a system for simultaneously drilling and logging a well;

FIG. 2 illustrates a pair of solenoids arranged in tandem to actuate the shaft of a valve;

FIG. 3 is an enlarged sectional view of one of the solenoids of FIG. 2;

FIG. 4 is a schematic diagram of a circuit used to control current through one or more solenoids for operating the pulse generator;

FIGS. 5–7 are a series of curves showing voltage and current wave forms in the circuit during its use to operate a valve in the pulse generator;

FIG. 8 is a block diagram illustrating an alternative to the control circuit of FIG. 4;

FIG. 9 illustrates the waveforms of the signals developed in the circuit of FIG. 8, and FIG. 10 is a detailed schematic diagram showing a circuit which is suitable for performing the control function illustrated in FIGS. 8 and 9.

DESCRIPTION OF SPECIFIC EMBODIMENTS

In the preferred embodiments of the invention, as described in detail below, pressure pulses are transmitted through a drilling fluid to send information from the vicinity of a drill bit on the lower end of a drill string in a well to the surface of the earth as the well is drilled. At least one downhole condition within the well is sensed, and a signal, usually analog, is generated to represent the sensed condition. The signal is used to control the bypass of the flow of drilling fluid around the drill bit such as to cause pressure pulses at the surface in a coded sequence, representing the downhole condition.

Referring to FIG. 1, a well 10 is drilled in the earth with a rotary drilling rig 12, which includes the usual derrick 14, derrick floor 16, draw works 18, hook 20, swivel 22, kelly joint 24, rotary table 26, and a drill string 28 made up of drill pipes secured to the lower end of the kelly joint 24 and to the upper end of a section of drill collars 32, which carry a drill bit 34. Drilling fluid (commonly called drilling mud in the field) circulates from a mud pit 36 through a mud pump 38, a desurger 40, a mud supply line 41, and into the swivel 22. The drilling mud flows down through the kelly joint, drill string and drill collars, and through jets (not shown) in the lower face of the drill bit. The drilling mud flows back up through an annular space 42 between the outer diameter of the drill string and the well bore to the surface, where it is returned to the mud pit through a mud return line 43. The usual shaker screen for separating formation cuttings from the drilling mud before it returns to the mud pit is not shown.

A transducer 44 in the mud supply line 41 detects variations in drilling mud pressure at the surface. The transducer generates electrical signals responsive to drilling mud pressure variations. These signals are transmitted by an electrical conductor 46 to a surface electronic processing system 48, such as that described in U.S. Pat. No. 4,078,620.

Referring to FIG. 2, a pulser valve 60 and a pair of solenoids 67 and 70 are illustrated in a sequence in which they may be employed in a drill collar.

The pulser valve 60 serves to generate the pressure pulses described above. The valve 60 is actuated by a stem 160 which in turn is actuated by the shafts or armatures 133 of the solenoids 67 and 70.

The two solenoids are identical, and may be conventional. Only the lower solenoid is shown in cross-section. Each solenoid includes an annular solenoid winding or coil 116 in an annular coil housing 117. When electrical current is passed through the coil, it creates a strong magnetic field in an annular core 118 in the upper end of the coil housing. A relatively small central vertical bore 120 extends through the core. The lower part of the coil housing includes a downwardly opening cylindrical recess 122 closed (except for bore 120) at its upper end by the lower face 124 of the core. A cylindrical solenoid armature or face plate 126 includes a central annular plunger 127, which makes a close, sliding fit within recess 122. An outwardly extending annular flange 129, integrally formed on the lower end of the plunger of each face plate, has an outer diameter equal to that of the coil housing. A body of oil (not shown) fills the solenoid housing and surrounds the two solenoids. Each face plate carries a longitudinally extending central shaft 133, which projects above and below the face plate. The upper end of the solenoid shaft of the lower solenoid extends up through bore 120 and bears against the lower end of the solenoid shaft of the upper solenoid. The solenoids are energized simultaneously so the solenoid face plates are driven upwardly together between about 1/16" and about 3/16" when the valve of this invention is to be opened. The two solenoids connected in tandem provide a strong force with a relatively small diameter required by the solenoids, thus permitting the pulser housing to be relatively small in diameter to minimize restriction of flow of drilling fluid past it. In the energized condition, each flange bears against the lower end of its respective coil housing, leaving a gap between the upper end of each plunger and the lower face of its respective core of between about 0.004" and about 0.015". When the solenoids are de-energized, the plungers drop to the position shown in FIG. 2, and the outwardly extending annular flange 129 on the lower end of the core of the face plate of the lower solenoid rests on an inwardly extending limit switch 136. When the flange 129 rests on the limit switch, the switch is held open, and there is a gap 137 (FIG. 3) in each solenoid between the upper face of the armature and the lower end of the core. The gap is set to be as small as practical to minimize the current needed to open the valve. For example, the armature need move only 1/16" to 3/16" to open the valve sufficiently to create a usable pressure pulse. Therefore, the gap is between about 1/16" and 3/16". When the solenoids are energized, each armature moves toward its respective core until the flange rests against its respective coil housing. This reduces the gap to only a few thousandths of an inch to minimize the holding current required to produce the force needed to hold the valve open. The switch and its operation are described in more detail below with respect to FIG. 4.

A power source (not shown in FIG. 2), such as a battery or a generator (not shown) driven by a turbine (not shown) through which drilling fluid flows, may be mounted in the pulser housing in the drill collar.

The valve opens and closes in response to electrical signals developed by the circuit shown in FIG. 4 or in FIG. 8. The circuit may be in a sealed chamber (not shown) within the pulser housing.

Referring to FIG. 4, a power supply 300 supplies current through a first conductor 301 to the solenoid coils 116, connected in series, and across which is connected a diode rectifier 302. The solenoid coils 116 are connected to ground 304 through a high impedance (low current) path which includes a rheostat 306 and a first transistor 310, the base of which is connected by conductor 312 to the output of a pulse generator 314. The input of a one-shot vibrator 316 is connected to the output of the pulse generator, and the output of the one-shot vibrator is connected to the base of a second transistor 318, the collector of which is connected to the end of the solenoid coils remote from the power source.

The emitter of the second transistor is grounded to provide a low impedance (high current) path for current through the solenoid windings. The R-C components (not shown) in the one-shot vibrator are connected by a line 319 to a contact of switch 136, which is open when the valve is closed. A compression spring 320 closes the switch when the valve opens, thereby resetting the one-shot vibrator, or grounding the R-C components in the one-shot vibrator to stop the pulse.

A sensor 322 (normally mounted in the drill collar near the drill bit) detects a downhole condition, such as, formation electrical resistivity, mud temperature, mud pressure, weight on drill bit, natural radioactivity of the formation, inclination of the borehole, or the like. The pulse generator delivers a coded sequence of pressure pulses in response to signals received from the sensor, and the pressure pulses are detected by the transducers 44 in the mud supply line at the surface.

When the valve is to be opened and closed to generate a negative pulse in the drilling fluid, the pulse generator applies a long, say, 500 milliseconds, pulse 324 (FIG. 5) to the input of the one-shot vibrator and to the base of the first transistor. The one-shot vibrator applies a short, say, 10 milliseconds, pulse 325 (FIG. 6) to the base of the second transistor, causing it to conduct d.c. electrical power from the power supply, through the solenoid coil windings, and to ground. The magnetic field developed by windings pulls each armature flange up against its respective coil winding, so each armature is only a few thousandths of an inch from its respective core. This provides maximum holding force for minimum current through the windings. The oil prevents entry of drilling fluid into the solenoid housing and cushions the solenoids against mechanical shock when energized.

The pulse from the one-shot vibrator lasts until the valve opens. At that time the lower solenoid flange moves away from switch 136, which closes and turns off or "quenches" the one-shot vibrator, causing the second transistor to stop conducting. The switch may be of any suitable type, such as a limit switch, proximity detector, magnetic switch, or the like. The high current through the second transistor may be interrupted in any one of a number of ways known to those skilled in the art. For example, the limit switch may reset the one-shot vibrator, or short the RC time constant portion of the one-shot vibrator to ground when the switch closes. Alternatively, the switch may be arranged to be normally closed in the high current path, and open when the armatures move, thereby interrupting the flow of current through the second transistor. The latter arrangement is least preferred because the switch contacts would be subject to large current loads.

The switch may even be omitted, and the vibrator set to provide a pulse of fixed duration, say, 10 milliseconds, which is ordinarily sufficient time for the valve to open. The duration of the short pulse is substantially less than that of the long pulse. For example, the short pulse duration is between about 1% and about 50% of that of the long pulse.

The resistance of the circuit through the second transistor is low so that a relatively large current of 4 to 5 amps flows through the solenoid coil windings, generating a sufficiently large force on the solenoid armatures that the solenoid shafts are driven upwardly to lift the valve disk off its seat, thereby permitting drilling fluid to flow from the annular space between the pulser housing and drill collar, through the valve, and into the annular space between the drill collar and well bore.

The diode connected across the solenoid coils permits the back e.m.f. generated in the coils when the second transistor stops conducting to cause "free wheel" current to flow through them as the large current drops to the lower value. This permits the duration of the short pulse to be minimized because the "free wheel" current provides additional force without drawing energy from the power source, and helps hold the valve open, if it should tend to "bounce" closed.

After the second transistor stops conducting, current continues to flow through the rheostat 306 and the first transistor 310 until the long pulse from the pulse generator terminates. The variable resistor is set so that the current flowing through the solenoid coil windings after the pulse from the one-shot vibrator has ended is just sufficient to hold the valve open against the pressure exerted by drilling fluid flowing through it against the fluid catcher. Once the solenoid is de-energized, the force exerted by the drilling fluid forces the valve stem down, thereby preventing further bypass of drilling fluid around the drilling bit, and completing a negative pressure pulse, which may be detected at the surface.

The power required to actuate the valve 60 initially is greater than that required to hold it in the actuated condition. The circuit of FIG. 4 provides such a reduction in power, thereby conserving energy and reducing the heat generated by the circuitry. For example, the current through the solenoid windings after the second transistor stops conducting is substantially less than, and usually less than about ten percent of, that required to open the valve. Ordinarily, the holding current is between about 1% and about 50% of the opening current, depending on the exact dimensions of the valve and the pressure drop due to the flow of drilling fluid. As indicated above, by letting each armature move to within a few thousandths of an inch of its respective core, a minimum amount of current through the solenoid windings generates a maximum force for holding the valve open. For example, by decreasing the gap from about 0.013" in a conventional solenoid to about 0.005", the holding current was cut to one-third, a power reduction of 900%. This conserves energy and permits the solenoids to be of minimum size for a given force, thereby permitting the diameter of the pulse generator to be minimized.

The variation of current flow through the solenoid windings with time, with and without "quenching" of the one-shot vibrator, is shown in FIG. 7. If the circuit is operated without the limit switch so that the pulse from the one-shot vibrator is a fixed amount, say, 10 milliseconds, rather than being cut off when the solenoid armatures start to move, the current through the solenoid windings varies with time, as shown in curve 330 of FIG. 7. Under those conditions, when the pulse from the one-shot vibrator is applied to the second transistor, current rises rapidly along lower portion 331 of curve 330 until the solenoid armatures start to move. In the example given in FIG. 7, this occurs when the current through the solenoid windings is slightly above 2 amps. At that point, the inductance of the solenoid windings increases, causing the current to decrease momentarily, and thereafter rise to a maximum value of almost 6 amps on the upper part of curve 330. When the one-shot multivibrator pulse is terminated at 10 milliseconds, the current through the solenoid windings does not fall to zero immediately. Instead, it follows the descending slope 332 due to the back e.m.f. "free wheel" current permitted to flow through the solenoid windings because of the diode rectifier connected across them. Thus, for about another 6 milliseconds a substantial amount of current continues to flow through the solenoid windings and hold the valve firmly open until open flow conditions stabilize. Thereafter, the current curve follows a horizontal portion 334 at a level of about 0.3 amps until the end of the 500-millisecond pulse from the pulse generator.

If the limit switch is used, the current follows the curve indicated by the leading portion 331 of curve 330 until the armature of the lower solenoid lifts from the limit switch, permitting that limit switch to close, thereby turning off the one-shot vibrator, or otherwise interrupting the flow of current through the second transistor. Thereafter, the current through the solenoid coils follows the dotted curve 336. Under these conditions, the one-shot vibrator is turned off after it has been on for about only 3 milliseconds. Thereafter, "free wheel" current continues through the solenoid windings for about another millisecond to provide a substantial force tending to hold the valve open in a steady condition. The current then levels off to a value of about 0.3 amps until the end of the long pulse.

The use of the limit switch to turn off the one-shot vibrator as soon as the valve opens saves a substantial amount of energy, namely, that equal to the difference in the areas under the curve 331, 330, and 332 versus the area under curve 331, 336. This reduces electric power requirements downhole and permits the solenoid windings to be of minimum size without danger of burning out.

FIG. 8 illustrates a control circuit that may be used instead of that shown in FIG. 4. The circuit of FIG. 8 is particularly suitable for use in logging arrangements where the source of power for operating the solenoid coils 116 is a turbine generator that is actuated by the flow of mud used in the drilling operation. In such arrangements the voltage $V_{IN}$ may typically vary from 48 to 96 volts so that good regulation is essential in order to obtain substantially constant current for actuating or holding the solenoid. The apparatus of FIG. 8 performs that function with high energy efficiency and with low heat generation, all of which are of major importance for instruments located in a drill string.

A transistor switch 400 is turned on and off by a switch control circuit 402. A resistor $R_s$ is employed in the discharge current leg to provide a control voltage $V_s$ for the control circuit which compares $V_s$ to a preset reference voltage $V_R$ and actuates the transistor switch when $V_s$ is equal to $V_R$ or when those signals have some other predetermined relationship.

As illustrated in FIG. 9, the switch 400 is turned on for fixed periods of time $t_0$ to $t_1$. It is turned off for periods of time $t_1$ to $t_2$ which are determined by the time required for the IR drop across $R_s$ to equal $V_R$.

A current $I_0$ is established and flows in the inductor 116 when the switch 400 is closed at time $t_0$. The switch 400 is opened after a brief fixed time $t_1$. At this time the inductor current has reached a value $I_1$. The current in the inductor-diode loop is monitored, and when the current has decayed back to the value of $I_0$ at time $t_2$, the switch is closed again for the fixed charge time. This cycle is then repeated.

In order to avoid unwanted resistance during the charge time, decay current sensing is done in the diode leg of the circuit. If the time period $t_1-t_0$ is kept short, the effective current in the inductor is $I_0$. If the charge time $t_1-t_0$ is short enough to keep the current change $I_1-I_0$ small compared to $I_0$, the inductor current is essentially a fixed DC value. The average supply current effectively becomes:

$$I_{IN}=I_0[(t_1-t_0)/(t_2-t_0)]$$

or the inductor current times the duty cycle (ratio of on time to cycle time). The duty cycle can be approximated (ignoring sense resistor loss):

$$[(t_1-t_0)/(t_2-t_0)]=(I_0R_L/V_{IN})$$

Thus, current in the solenoid coils 116 is maintained by means of charge and discharge cycles, the circuit losses are minimized because the control element operates in a switching mode, and current sensing does not interfere with the main current source path. The current from the source 300 is applied directly to the load inductor 116 during the charge cycle to provide power efficiently, and the current produced by the inductor during the discharge cycle is also employed for efficiency. $R_s$ has very small resistance so that little power is lost in developing $V_s$ during the discharge cycles.

FIG. 10 shows a detailed circuit for implementing the broad concept illustrated in FIG. 8.

The switch 400 employs transistors Q1, Q2 and Q3 in a conventional switching circuit.

The switch control 402 employs an integrated circuit 404 which may be Fairchild Model 78S40. Other suitable integrated circuits are the Texas Instruments TI 497 or the 1524 or 3524 that are available from multiple sources. The integrated circuit is enclosed by dashed lines, and the numerals employed by the manufacturer to identify connections for the integrated circuit are shown. It constitutes a fixed on period switching regulator. The on time is determined by the capacitance of $C_t$. A suitable on time for this embodiment of the invention is 200 $\mu$sec.

As illustrated in FIG. 5, the pulse generator 314 applies a long, say 500 millisecond, pulse. That pulse activates the transistor Q4 which then turns on transistor Q6.

Transistor Q6 turns the system on and off through line 406. When the transistor Q6 is off, the full voltage V is applied through Rx to the operational amplifier in the integrated circuit 404 to force its output to always exceed the reference signal $V_R$ that is applied over line 408 to the comparator in the integrated circuit 404.

When the transistor Q6 is turned on by the pulse from pulse generator 314 and transistor Q4, the system is turned on because the voltage on line 406 is reduced by the IR drop across Rx.

The pulse from the pulse generator 314 and transistor Q4 also actuates the one shot multivibrator 316 which applies a short, say 40 millisecond, pulse to the base of the transistor Q5 causing it to turn off. This applies the entire supply voltage V through RA as the reference signal $V_R$ over line 408 to the integrated circuit 404.

The reference signal $V_R$ and the control voltage $V_s$ are compared in the integrated circuit 404 and it generates a signal to turn on the switch 400 when $V_s$ decays sufficiently to equal $V_R$. The switch applies power from the source $V_{IN}$ to the coils 116 of the solenoids. A large current, determined in part by the $R_F/R_I$ feedback ratio, is applied to the coils to actuate the solenoid shaft or armature 133 and the valve stem 160.

When the solenoid shaft or armature 133 is actuated to move upwardly as illustrated in FIG. 10, a switch 30 closes to connect line 410 to ground, thereby resetting the one shot mutivibrator $OS_1$ which in turn applies a signal to turn transistor Q5 on. This causes the reference signal $V_R$ to be reduced by the ratio of $R_B/(R_A+R_B)$. The regulator responds to the lower reference voltage $V_R$ and reduces the current that is applied to the coils 116 by the same ratio, thereby providing a holding current that is considerably less than the large current that was initially applied. The holding current is applied to the coils 116 until the end of the pulse produced by the pulse generator 314, at which time transistor Q6 is turned off causing the entire supply voltage V to be applied over the line 406 to prevent the regulator from supplying current to the coils 116 until the pulse generator 314 generates the next pulse.

If desired, the switch 30 may be omitted, and the one shot multivibrator $OS_1$ may be timed to automatically reset after a selected period of time of sufficient duration for the armature 133 of the solenoid to be actuated, such as 10 milliseconds. When the one shot multivibrator $OS_1$ resets it provides a signal that turns on transistor Q5 to reduce the reference voltage $V_R$, as before.

The two solenoids acting in tandem and simultaneously in the same direction provide a large lifting force, and yet are smaller in diameter than a single solenoid which would supply the same force with the same current. Accordingly, the pulser housing can be made relatively slim to minimize pressure drop in the drilling fluid as it flows down the drill string. This also permits the use of drill collars with a smaller outside diameter for deep drilling as well casing diameter progressively decreases.

Another advantage of the two solenoids working together is that the solenoid shafts and valve stem work together by simple abutment without requiring any complicated linkages which would break, jam, or permit misalignment, during operation.

We claim:

1. A circuit comprising:
 (a) a source of electrical power having a pair of output terminals;
 (b) a solenoid winding;
 (c) an armature mounted adjacent the winding to move when an electric current passes through the winding;
 (d) a first switch arranged to connect the winding across the terminals through a first path of relatively low electrical impedance;
 (e) a second switch arranged to connect the winding across the terminals through a second path of relatively high electrical impedance;
 (f) a long-pulse generator having an input and an output;
 (g) a short-pulse generator having an input and an output;
 (h) means connecting the long-pulse generator output to the input of the short-pulse generator and to the second switch;
 (i) means connecting the short-pulse generator output to the first switch;
 (j) means for activating the long-pulse generator to apply a relatively long pulse to the short-pulse generator input and to the second switch, whereby the first switch is made conducting for the duration of a short pulse from the short-pulse generator, and the second switch is made conducting for the duration of the long pulse;
 (k) means for sensing the movement of the armature; and
 (l) means responsive to armature movement for terminating the output of the short-pulse generator to interrupt the current through the first path.

2. A circuit according to claim 1 in which the short-pulse generator is a one-shot multivibrator.

3. Apparatus for controlling the flow of current from a source of direct current power comprising:
 (a) a solenoid having inductive windings for actuating an armature,
 (b) switching means for connecting the inductive windings to the source of direct current power,
 (c) means for providing an electric discharge path for the inductive windings when said switching means is off,
 (d) a long-pulse generator for providing an electric pulse for a predetermined period of time,
 (e) a short-pulse generator coupled to the long-pulse generator for providing an electric pulse having a duration less than that of the long pulse,
 (f) control means coupled between the long-pulse generator and said switching means for turning on the switching means when the long pulse is initiated to provide an electric current to the inductive windings and actuate said armature,
 (g) means responsive to movement of the armature of the solenoid for causing said short-pulse generator to provide an electric signal after the armature of the solenoid is actuated,
 (h) means coupled to said short-pulse generator and responsive to said electrical signal for reducing the flow of electric current to the inductive windings to a value which will hold the armature in an activated condition, and
 (i) means coupled to said long-pulse generator for turning off said switching means at the end of said predetermined period of time.

4. Apparatus for controlling the flow of current from a source of direct-current comprising:
 (a) a solenoid having inductive windings for actuating an armature,
 (b) switching means for connecting the inductive windings to the source of direct current selectively through a low impedance path or a high impedance path,
 (c) a freewheeling diode for providing a discharge path for the inductive windings when said switching means is off,
 (d) a first pulse generator for providing an electric pulse for a predetermined period of time,
 (e) a second pulse generator coupled between the first pulse generator and said switching means for actuating the switching means to provide a low impedance path when said electric pulse is initiated to provide an electric current to the inductive windings and actuate said armature,
 (f) sensing means for sensing movement of said armature and for providing an electric signal when the armature is actuated,
 (g) means responsive to the signal produced by said sensing means for actuating the switching means to provide a high impedance path, thereby reducing the flow of electric current to the inductive windings to a value required to hold the armature in an activated condition, and (h) means coupled to the first pulse generator for turning off said switching means at the end of said electric pulse.

5. Apparatus for controlling the flow of current from a source of direct current power comprising:
(a) a solenoid having inductive windings for actuating an armature,
(b) switching means for connecting the inductive windings to the souce of direct current power,
(c) means for providing an electric discharge path for the inductive windings when said switching means is off,
(d) a long-pulse generator for providing an electric pulse for a predetermined period of time,
(e) a short-pulse generator coupled to the long-pulse generator for providing an electric pulse having a duration less than that of the long pulse,
(f) control means coupled between the long-pulse generator and said switching means for turning on the switching means when the long pulse is initiated to provide an electric current of substantially constant value to the inductive windings and actuate said armature,
(g) means responsive to movement of the armature of the solenoid for causing said short-pulse generator to provide an electric signal after the armature of the solenoid is actuated,
(h) means coupled to said short-pulse generator and responsive to said electrical signal for reducing the flow of electric current to the inductive windings to a substantially constant value which will hold the armature in an activated condition, and
(i) means coupled to said long-pulse generator for turning off said switching means at the end of said predetermined period of time.

* * * * *